(12) United States Patent
Li et al.

(10) Patent No.: US 10,839,723 B2
(45) Date of Patent: Nov. 17, 2020

(54) FLEXIBLE DISPLAY

(71) Applicant: WUHAN CHINA STAR OPTOELECTRONICS SEMICONDUCTOR DISPLAY TECHNOLOGY CO., LTD., Wuhan (CN)

(72) Inventors: Wu Li, Wuhan (CN); Peiyu Lai, Wuhan (CN); Wei Bi, Wuhan (CN); Huan Xu, Wuhan (CN); Hong Gao, Wuhan (CN); Hanning Yang, Wuhan (CN)

( * ) Notice: Subject to any disclaimer, the term of this patent is extended or adjusted under 35 U.S.C. 154(b) by 143 days.

(21) Appl. No.: 16/315,640

(22) PCT Filed: Sep. 17, 2018

(86) PCT No.: PCT/CN2018/105935
§ 371 (c)(1),
(2) Date: Jan. 6, 2019

(87) PCT Pub. No.: WO2020/042243
PCT Pub. Date: Mar. 5, 2020

(65) Prior Publication Data
US 2020/0074893 A1    Mar. 5, 2020

(51) Int. Cl.
| | | |
|---|---|---|
| H05K 1/02 | (2006.01) |
| H05K 3/22 | (2006.01) |
| H05K 3/30 | (2006.01) |
| H05K 3/36 | (2006.01) |
| H05K 3/46 | (2006.01) |
| H05K 5/00 | (2006.01) |
| H05K 5/02 | (2006.01) |
| G09F 9/30 | (2006.01) |
| H01L 51/00 | (2006.01) |
| H01L 51/52 | (2006.01) |
| H01L 51/56 | (2006.01) |

(52) U.S. Cl.
CPC .......... *G09F 9/301* (2013.01); *H01L 51/0097* (2013.01)

(58) Field of Classification Search
CPC .. H05K 1/02; H05K 3/22; H05K 3/30; H05K 3/36; H05K 3/46; H05K 5/00; H05K 5/02; G09F 9/30; G09F 9/301; H01L 51/00; H01L 51/52; H01L 51/56; H01L 51/0097
USPC ...... 174/250; 361/749, 679.02; 349/149–152
See application file for complete search history.

(56) References Cited

U.S. PATENT DOCUMENTS

| | | | | |
|---|---|---|---|---|
| 5,739,887 A | * | 4/1998 | Ueda ................ | G02F 1/133604 349/149 |
| 5,838,400 A | * | 11/1998 | Ueda ................ | G02F 1/133604 349/58 |

(Continued)

FOREIGN PATENT DOCUMENTS

| | | |
|---|---|---|
| CN | 108231852 A | 6/2018 |
| CN | 108281576 A | 7/2018 |

*Primary Examiner* — Xiaoliang Chen (57) ABSTRACT

A flexible display is provided. The flexible display includes a flexible panel and a backboard body fixedly connected with the flexible panel. A glue-free surface is disposed on a side of the backboard body away from the flexible panel, and the backboard body includes a first backboard and a second backboard. At least one mark is disposed on the glue-free surface of the first backboard and the glue-free surface of second backboard, and all of the marks on the same backboard are arranged along a length direction of a bending line.

10 Claims, 5 Drawing Sheets

(56) References Cited

U.S. PATENT DOCUMENTS

| | | | |
|---|---|---|---|
| 2008/0030666 A1* | 2/2008 | Abe | G02F 1/13452 349/150 |
| 2011/0099804 A1* | 5/2011 | Hamada | G02F 1/13452 29/832 |
| 2017/0257988 A1* | 9/2017 | Choi | B29C 53/04 |
| 2018/0019417 A1* | 1/2018 | Andou | H05K 1/0269 |
| 2018/0022013 A1* | 1/2018 | Choi | B29C 53/36 156/196 |
| 2018/0027673 A1* | 1/2018 | Andou | H01L 51/0097 361/749 |
| 2018/0040638 A1* | 2/2018 | Wu | H01L 27/1248 |
| 2018/0070455 A1* | 3/2018 | Lee | G06F 1/1652 |
| 2019/0058028 A1* | 2/2019 | Won | H01L 51/56 |
| 2020/0074893 A1* | 3/2020 | Li | G09F 9/301 |
| 2020/0144303 A1* | 5/2020 | Kajiyama | H05B 33/02 |

* cited by examiner

FLEXIBLE DISPLAY

CROSS REFERENCE TO RELATED APPLICATIONS

This application is a U.S. National Phase application submitted under 35 U.S.C. § 371 of Patent Cooperation Treaty Application serial No. PCT/CN2018/105935, filed on Sep. 17, 2018, which claims the priority of China Patent Application serial No. 201811014765.5, filed on Aug. 31, 2018, the disclosures of which are incorporated herein by reference in their entirety.

FIELD OF INVENTION

The present invention relates to field of display technologies, and more particularly to a flexible display.

BACKGROUND OF INVENTION

Figure 1:
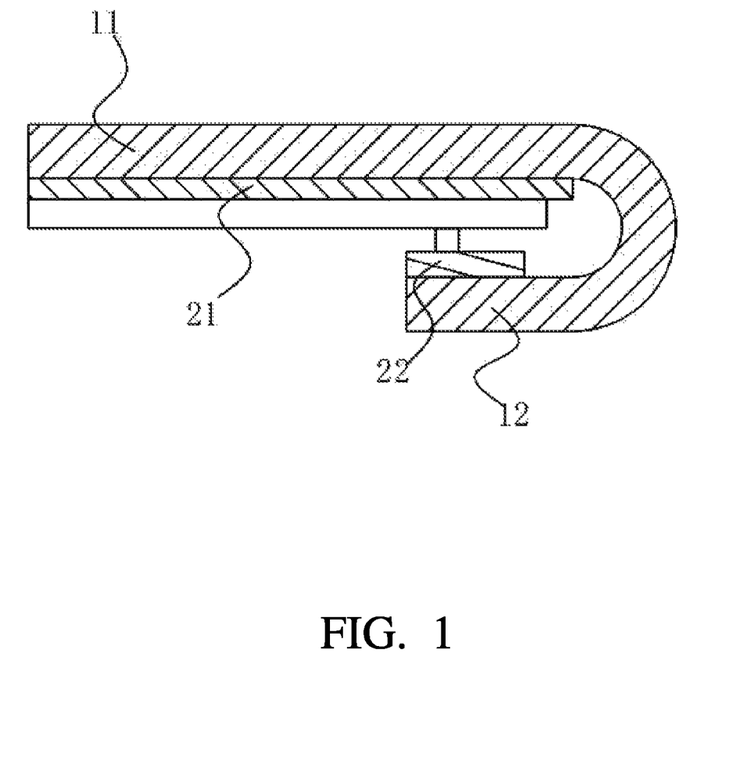
FIG. 1 is a schematic structural view of an OLED in the background art of the present invention.

With development of technology and the improvement of product requirements, people's demands for screen ratio of displays are higher and higher. In organic light-emitting diode (OLED) products, as shown in FIG. 1, a non-display area 12 can be hidden under a display area 11 by bending a portion of the non-display area 12 of OLED, and attached to the first backboard 21 through the second backboard 22, thereby fixing the hidden non-display area 12. This method has become an effective technical means to increase the screen ratio.

Figure 2:
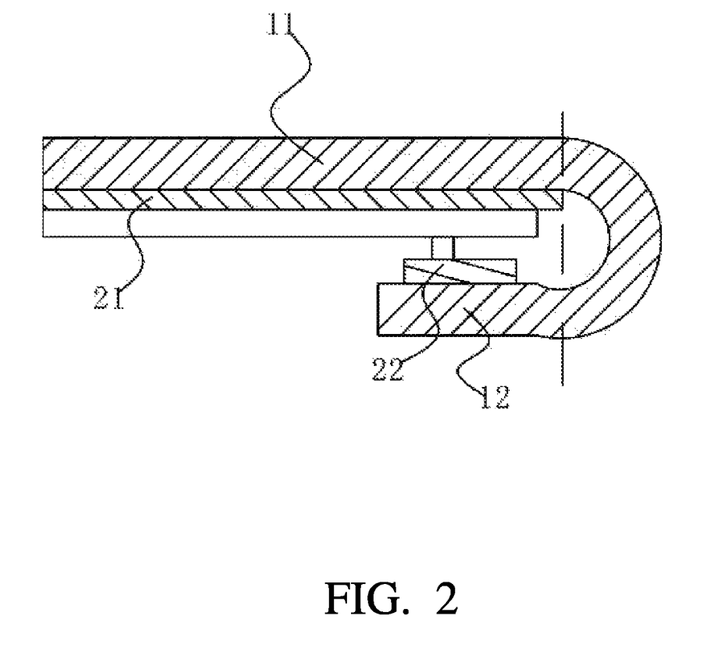
FIG. 2 is a schematic diagram of a first backboard and a second backboard in the OLED according to the background art of the present invention.

In order to achieve a higher screen ratio, it is necessary to reduce the bending radius of the bending area, which requires an improvement in the attachment accuracy of the second backboard 22. However, in production, because of the attachment accuracy, as shown in FIG. 2, after bending the non-display area 12, the edge of the first backboard 21 is usually not in the same cross-section as the edge of the second backboard 22. It is easy to cause stress concentration after forming a misalignment. Therefore, it is easy to cause damage during production to the line in the bending area.

Technical Problem

The present invention provides a flexible display, in order to solve the technical problem that after bending the non-display area, the edge of the first backboard is usually not in the same cross-section as the edge of the second backboard, and the stress concentration is caused after the misalignment is formed, thereby causing damage to the line of the product bending area.

SUMMARY OF INVENTION

A flexible display, comprising:
a flexible panel; and
a backboard body fixedly connected with the flexible panel, wherein a glue surface is disposed on the backboard body, and the glue surface is coated with an adhesive; a glue-free surface is disposed on a side of the backboard body away from the flexible panel, the backboard body includes a first backboard and a second backboard independent of each other;
wherein at least one mark is disposed on the glue-free surface of the first backboard and the glue-free surface of second backboard, and all of the marks on the same backboard are arranged along a length direction of a bending line.

Preferably, a first mark is disposed on a first glue-free surface of the first backboard, and a second mark is disposed on a second glue-free surface of the second backboard and corresponding to the first mark after bonding the flexible panel.

Preferably, a dimension of the first mark and a dimension of the second mark are both 50-2000 micrometers.

Preferably, a distance between two of the first marks adjacent to each other is greater than or equal to three times the dimension of the first mark, and a distance between two of the second marks adjacent to each other is greater than or equal to three times the dimension of the second mark.

Preferably, when the flexible panel is in a bent state, a projection of the first mark projected on the second backboard is coincident with the second mark.

Preferably, when the flexible panel is in a bent state, a projection of the first mark projected on the second backboard is not coincident with the second mark.

Preferably, a minimum distance between the projection of the first mark projected on the second backboard and the second mark after the flexible panel be bent is less than or equal to 10 mm.

Preferably, the first mark and the second mark are both die cut marks, and a depth of the first mark and a depth of the second mark are both greater than or equal to 10 micrometers.

Preferably, the first mark and the second mark are both printed marks, and a line width of the first mark and a line width of the second mark are both 1-50 micrometers.

Preferably, a line thickness of the first mark and a line thickness of the second mark are both 1-100 micrometers.

A flexible display, comprising:
a flexible panel; and
a backboard body fixedly connected with the flexible panel, wherein a glue-free surface is disposed on a side of the backboard body away from the flexible panel, and the backboard body includes a first backboard and a second backboard;
wherein at least one mark is disposed on the glue-free surface of the first backboard and the glue-free surface of the second backboard, and all of the marks on the same backboard are arranged along a length direction of a bending line.

Preferably, a first mark is disposed on a first glue-free surface of the first backboard, and a second mark is disposed on a second glue-free surface of the second backboard and corresponding to the first mark after bonding the flexible panel.

Preferably, a dimension of the first mark and a dimension of the second mark are both 50-2000 micrometers.

Preferably, a distance between two of the first marks adjacent to each other is greater than or equal to three times the dimension of the first mark, and a distance between two of the second marks adjacent to each other is greater than or equal to three times the dimension of the second mark.

Preferably, when the flexible panel is in a bent state, a projection of the first mark projected on the second backboard is coincident with the second mark.

Preferably, when the flexible panel is in a bent state, a projection of the first mark projected on the second backboard is not coincident with the second mark.

Preferably, a minimum distance between the projection of the first mark projected on the second backboard and the second mark after the flexible panel be bent is less than or equal to 10 mm.

Preferably, the first mark and the second mark are both die cut marks, and a depth of the first mark and a depth of the second mark are both greater than or equal to 10 micrometers.

Preferably, the first mark and the second mark are both printed marks, and a line width of the first mark and a line width of the second mark are both 1-50 micrometers.

Preferably, a line thickness of the first mark and a line thickness of the second mark are both 1-100 micrometers.

Beneficial Effect

Use equipment to bend the flexible panel, use charge-coupled device (CCD) to capture the marks on the first backboard and the second backboard, and use the first mark and the second mark for alignment, thereby accurately attaching the second backboard on the first backboard. Therefore, the edge of the attached second backboard is in the same cross-section as the edge of the first backboard. So that stress concentration caused by misalignment between the edge of the first backboard and the edge of the second backboard can be prevent, and then the damage to the line of the product bending area can be prevent.

DESCRIPTION OF DRAWINGS

In order to more clearly illustrate the technical solutions in the embodiments or the prior art, the following drawings, which are intended to be used in the description of the embodiments or the prior art, will be briefly described. It will be apparent that the drawings and the following description are only some embodiments of the present invention. Those of ordinary skill in the art may, without creative efforts, derive other drawings from these drawings.

REFERENCE NUMERALS

10: flexible panel, 11: display area, 12: non-display area; 20: backboard body, 21: first backboard, 22: second backboard, 30: release film, 40: bending line, 50: first mark, 60: second mark.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", "left", "right", "inside", "outside", "side", etc., is used with reference to the orientation of the figure(s) being described. As such, the directional terminology is used for purposes of illustration and is in no way limiting. Throughout this specification and in the drawings like parts will be referred to by the same reference numerals.

The present invention is directed to existing flexible displays, technical problem of which is that after bending the non-display area, the edge of the first backboard is usually not in the same cross-section as the edge of the second backboard, and the stress concentration is caused after the misalignment is formed, thereby causing damage to the line of the product bending area. The present invention can solve the above problem.

It should be noted that the flexible display in the present invention may be a display device such as a mobile phone or a tablet computer.

Figure 3:
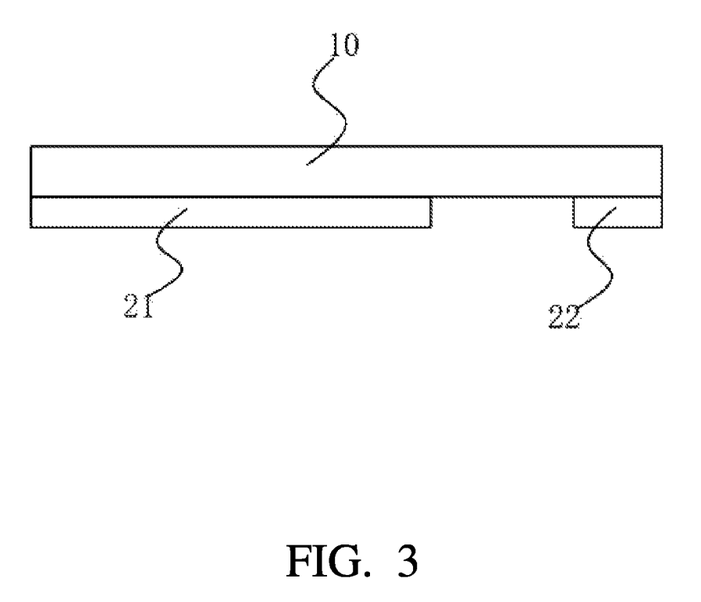
FIG. 3 is a schematic structural diagram of a flexible display according to an embodiment of the present invention.
Figure 4:
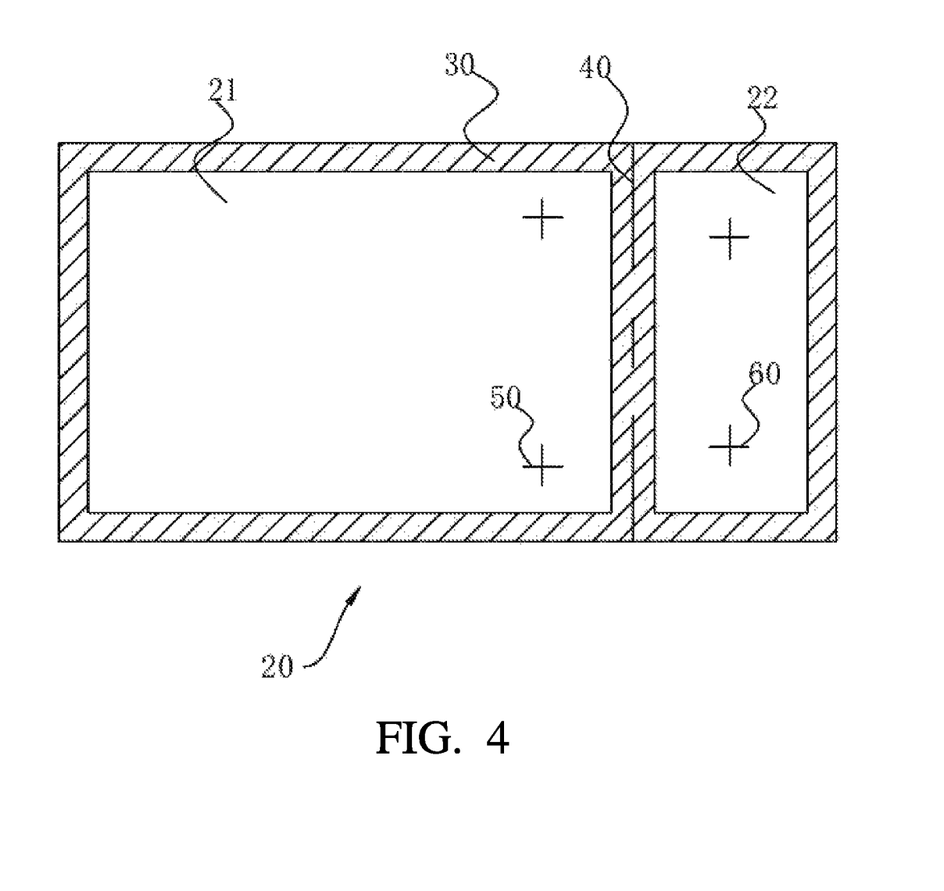
FIG. 4 is a schematic structural diagram of a backboard body according to an embodiment of the present invention.

A flexible display, as shown in FIG. 3 or FIG. 4, the flexible display includes a flexible panel 10 and a backboard body 20 fixedly connected with the flexible panel, wherein a glue surface is disposed on the backboard body 20, and the glue surface is coated with an adhesive. The backboard body 20 is connected to the flexible panel 10 by the adhesive. When fitting the flexible panel 10 and the backboard body 20, the backboard body 20 is attached to the reverse side of the flexible panel 10 by a laminating machine.

Wherein a glue-free surface is disposed on a side of the backboard body 20 away from the flexible panel 10, and a release film 30 is disposed on the glue-free surface. The backboard body 20 includes a first backboard 21 and a second backboard 22 independent of each other, wherein at least one mark is disposed on the glue-free surface of the first backboard 21 and the glue-free surface of second backboard 22, and all of the marks on the same backboard are arranged along a length direction of a bending line 40.

When bending, remove the release film 30 on the glue-free surface, use equipment to bend the flexible panel, use charge-coupled device (CCD) to capture the mark on the first backboard 21 and the second backboard 22, and use the mark on the first backboard 21 and the mark on the second backboard 22 for alignment. Therefore, the second backboard 22 is accurately attached to the first backboard 21, and the alignment is more accurate. Stress concentration caused by misalignment between the edge of the first backboard 21 and the edge of the second backboard 22 can be prevent, and then the damage to the line of the product bending area can be prevented.

A first mark 50 is disposed on a first glue-free surface of the first backboard 21, and a second mark 60 is disposed on a second glue-free surface of the second backboard 22 and corresponding to the first mark 50 after bonding the flexible panel 10.

Specifically, a dimension of the first mark 50 and a dimension of the second mark 60 are both 50-2000 micrometers. In the drawing of the preferred embodiment, only a "+" shaped mark is illustrated, it can be understood that, in a specific implementation, the shape of the mark includes, but not limited to, "+", "−", "T", "L", "O", ".". Correspondingly, the dimension of the mark in this embodiment may be a length dimension, a width dimension, a radius of a minimum circumscribed circle or a radius of a maximum inscribed circle, and is selected according to specific implementation requirements.

Wherein a distance between two of the first marks 50 adjacent to each other is greater than or equal to three times the dimension of the first mark 50, and a distance between two of the second marks 60 adjacent to each other is greater than or equal to three times the dimension of the second mark 60. The distance prevents the marks on the same backboard from overlapping and allows the CCD to capture the mark on the first backboard 21 and the mark on the second backboard 22.

In an embodiment of the invention, when the flexible panel 10 is in a bent state, a projection of the first mark 50 projected on the second backboard 22 is coincident with the second mark 60.

Figure 5:
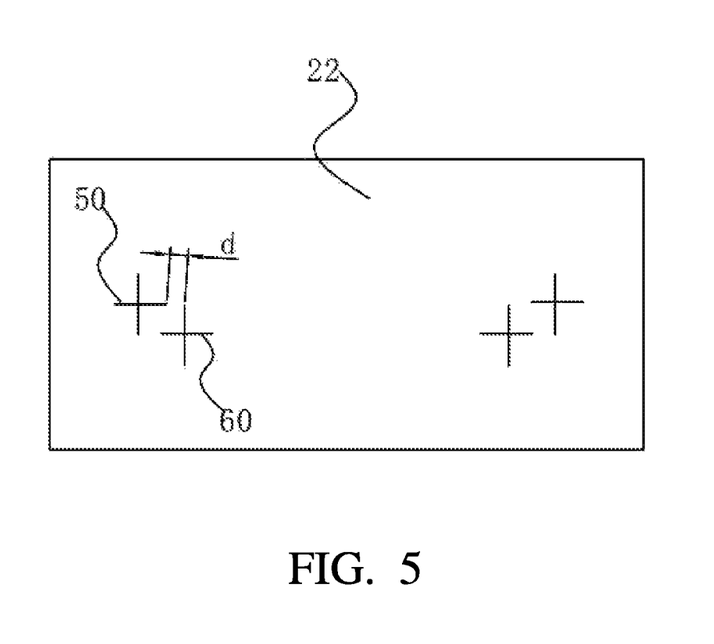
FIG. 5 is a schematic diagram of a projection of a first mark on a second backboard in an embodiment of the present invention.

As shown in FIG. 5, in another embodiment of the present invention, when the flexible panel 10 is in a bent state, a projection of the first mark 50 projected on the second backboard 22 is not coincident with the second mark 60.

A minimum distance d between the projection of the first mark 50 projected on the second backboard 22 and the second mark 60 after the flexible panel 10 be bent is less than or equal to 10 mm.

Wherein the mark can be formed in various ways, such as formed by die cutting or formed by printing.

When the mark is formed by die cutting, the depth of the knife is full cut or half cut. A depth of the first mark 50 and a depth of the second mark 60 are both greater than or equal to 10 micrometers, and the width of the cutting blade is 1-100 micrometers. It is convenient for the CCD to capture the mark on the first backboard 21 and the second backboard 22 while reducing the area occupied by the mark.

When the mark is formed by printing, a line width of the first mark 50 and a line width of the second mark 60 are both 1-50 micrometers, and a line thickness of the first mark 50 and a line thickness of the second mark 60 are both 1-100 micrometers.

It should be noted that, in the present invention, when performing a mark processing on the backboard body 20, the same blade set is used for die cutting. That is, the blade set for the mark processing and the blade for forming the backboard body 20 are the same blade set.

The beneficial effects of the invention:

use equipment to bend the flexible panel 10, use charge-coupled device (CCD) to capture the marks on the first backboard 21 and the second backboard 22, and use the first mark 50 and the second mark 60 for alignment, thereby accurately attaching the second backboard 22 on the first backboard 21. Therefore, the edge of the attached second backboard 22 is in the same cross-section as the edge of the first backboard 21, so that stress concentration caused by misalignment between the edge of the first backboard 21 and the edge of the second backboard 22 can be prevented, and then the damage to the line of the product bending area can be prevented.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A flexible display, comprising:
    a flexible panel; and
    a backboard body fixedly connected with the flexible panel, wherein a glue surface is disposed on the backboard body, and the glue surface is coated with an adhesive; a glue-free surface is disposed on a side of the backboard body away from the flexible panel, the backboard body includes a first backboard and a second backboard independent of each other;
    wherein at least one mark is disposed on the glue-free surface of the first backboard and the glue-free surface of second backboard, and all of the marks on the same backboard are arranged along a length direction of a bending line.

2. The flexible display according to claim 1, wherein a first mark is disposed on a first glue-free surface of the first backboard, and a second mark is disposed on a second glue-free surface of the second backboard and corresponding to the first mark after bonding the flexible panel.

3. The flexible display according to claim 2, wherein a dimension of the first mark and a dimension of the second mark are both 50-2000 micrometers.

4. The flexible display according to claim 2, wherein a distance between two of the first marks adjacent to each other is greater than or equal to three times the dimension of the first mark, and a distance between two of the second marks adjacent to each other is greater than or equal to three times the dimension of the second mark.

5. The flexible display according to claim 2, wherein when the flexible panel is in a bent state, a projection of the first mark projected on the second backboard is coincident with the second mark.

6. The flexible display according to claim 2, wherein when the flexible panel is in a bent state, a projection of the first mark projected on the second backboard is not coincident with the second mark.

7. The flexible display according to claim 6, wherein a minimum distance between the projection of the first mark projected on the second backboard and the second mark after the flexible panel be bent is less than or equal to 10 mm.

8. The flexible display according to claim 2, wherein the first mark and the second mark are both die cut marks, and a depth of the first mark and a depth of the second mark are both greater than or equal to 10 micrometers.

9. The flexible display according to claim 2, wherein the first mark and the second mark are both printed marks, and a line width of the first mark and a line width of the second mark are both 1-50 micrometers.

10. The flexible display according to claim 9, wherein a line thickness of the first mark and a line thickness of the second mark are both 1-100 micrometers.

\* \* \* \* \*

UNITED STATES PATENT AND TRADEMARK OFFICE
CERTIFICATE OF CORRECTION

PATENT NO. : 10,839,723 B2  
APPLICATION NO. : 16/315640  
DATED : November 17, 2020  
INVENTOR(S) : Wu Li et al.

Page 1 of 1

It is certified that error appears in the above-identified patent and that said Letters Patent is hereby corrected as shown below:

On the Title Page

Item [30], insert:  
--201811014765.5--

Signed and Sealed this  
Twenty-third Day of February, 2021

Drew Hirshfeld  
*Performing the Functions and Duties of the*  
*Under Secretary of Commerce for Intellectual Property and*  
*Director of the United States Patent and Trademark Office*